US007411283B2

(12) United States Patent
Hockanson et al.

(10) Patent No.: US 7,411,283 B2
(45) Date of Patent: Aug. 12, 2008

(54) INTERCONNECT DESIGN FOR REDUCING RADIATED EMISSIONS

(75) Inventors: David M. Hockanson, Boulder Creek, CA (US); Rodney D. Slone, Redwood City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 243 days.

(21) Appl. No.: 11/353,897

(22) Filed: Feb. 14, 2006

(65) Prior Publication Data

US 2007/0188997 A1 Aug. 16, 2007

(51) Int. Cl.
*H01L 23/02* (2006.01)
(52) U.S. Cl. .................. 257/678; 361/794; 361/792; 361/799
(58) Field of Classification Search .......... 257/678, 257/697, 704; 361/760, 792, 794, 795, 799 361/174, 261
See application file for complete search history.

(56) References Cited

U.S. PATENT DOCUMENTS

| 6,532,439 | B2 |   | 3/2003  | Anderson |         |
|-----------|----|---|---------|----------|---------|
| 6,571,184 | B2 |   | 5/2003  | Anderson |         |
| 6,573,590 | B1 | * | 6/2003  | Radu et al. | 257/660 |
| 6,683,796 | B2 |   | 1/2004  | Radu |         |
| 6,789,241 | B2 |   | 9/2004  | Anderson |         |
| 6,850,878 | B2 | * | 2/2005  | Smith et al. | 703/18 |
| 6,944,025 | B2 | * | 9/2005  | Hockanson et al. | 361/719 |
| 6,956,285 | B2 | * | 10/2005 | Radu et al. | 257/697 |
| 7,265,993 | B1 | * | 9/2007  | Slone et al. | 361/760 |

| 2003/0156400 | A1 | 8/2003  | Dibene |
|--------------|----|---------|--------|
| 2003/0231451 | A1 | 12/2003 | Anthony |
| 2004/0062020 | A1 | 4/2004  | Leung  |
| 2004/0238857 | A1 | 12/2004 | Beroz et al. |

OTHER PUBLICATIONS

D. M. Hockanson, Xiaoning Ye, J. L. Drewniak, T. H. Hubing, T. P. Van Doren, and R. E. DuBroff, "FDTD and experimental investigation of EMI from stacked-card PCB configurations", IEEE Transactions on Electromagnetic Compatibility, pp. 1-10, Feb. 2001.
D. Hockanson and R. D. Slone, "Investigation of EMI coupling at CPU interconnect", in 2004 IEEE International Symposium on EMC. IEEE EMC Society, Aug. 2004, vol. 2, pp. 424-429.

* cited by examiner

*Primary Examiner*—Zandra Smith
*Assistant Examiner*—Telly D Green
(74) *Attorney, Agent, or Firm*—Robert C. Kowert; Meyertons, Hood, Kivlin, Kowert & Goetzel, P.C.

(57) ABSTRACT

An interconnect system between an integrated circuit device and a printed circuit board may include a filter between the integrated circuit device and the power subsystem of the printed circuit board. The filter may be a low-pass filter that reduces current in a higher frequency range without negatively modifying current in a lower frequency range and may reduce radiated emissions produced during operation of the integrated circuit. The filter may be implemented by arranging core-power voltage conductors and ground conductors at a first or second level interconnect into one or more voltage groupings and one or more adjacent ground groupings such that series inductance is increased. In some embodiments, the first level interconnect may include conductive bumps or pads between an integrated circuit and a substrate. In some embodiments, the second level interconnect may include solder balls, pins, pads, or other conductors of a package, socket, or interposer.

20 Claims, 12 Drawing Sheets

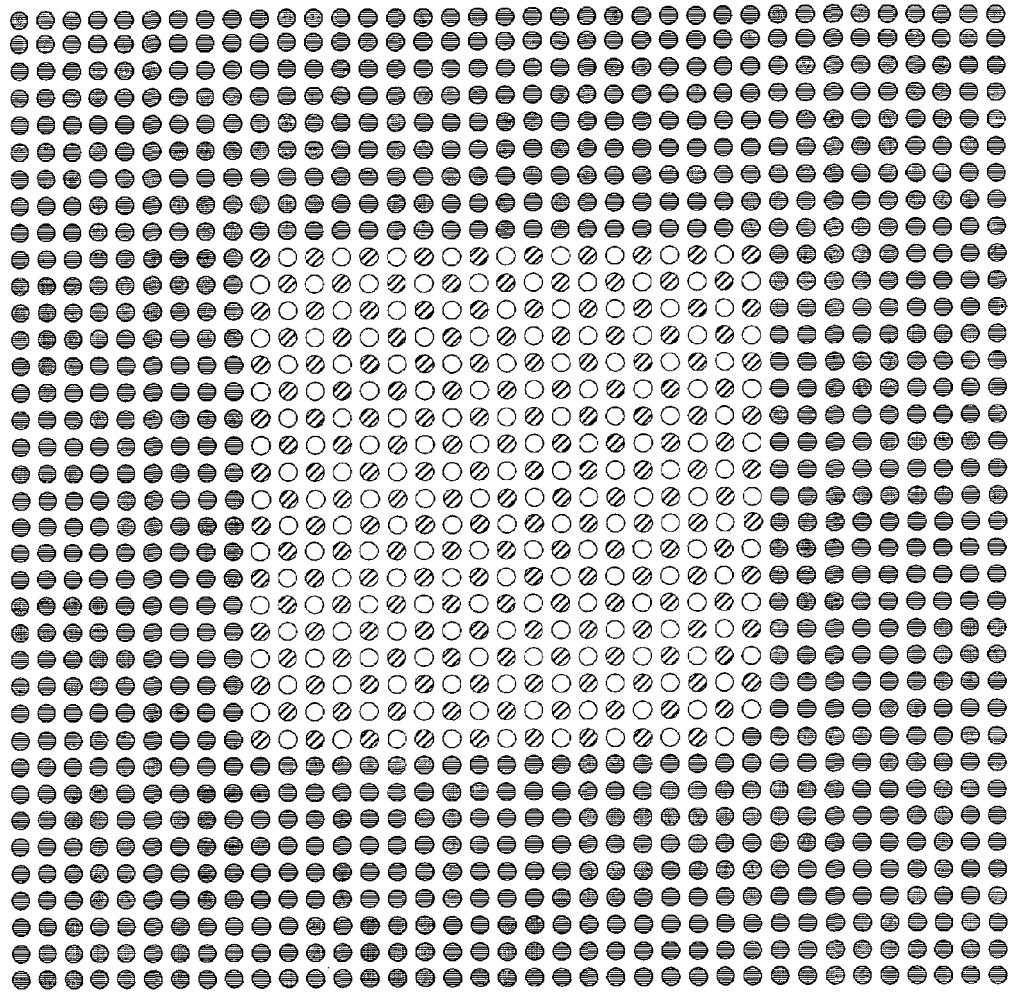
FIG. 1
*(prior art)*
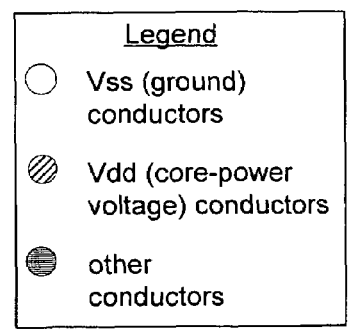

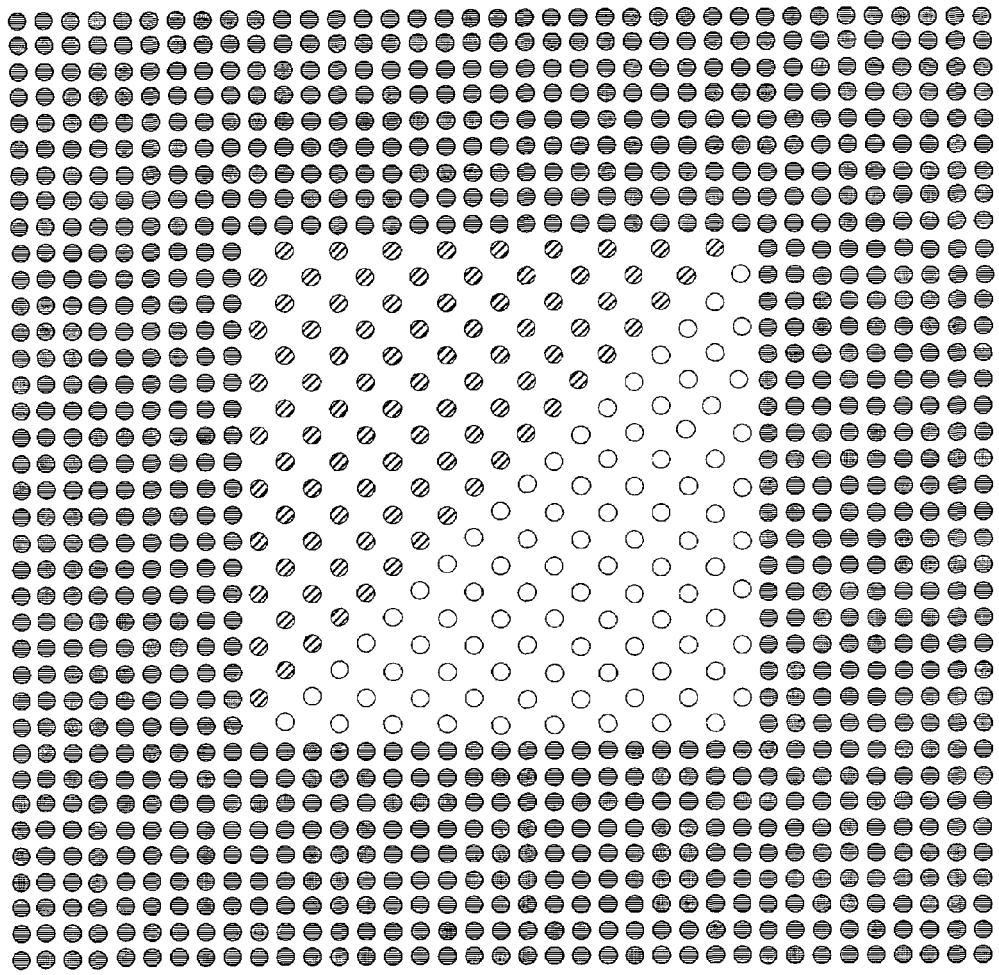
FIG. 6A
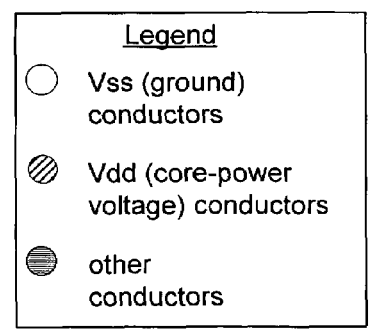

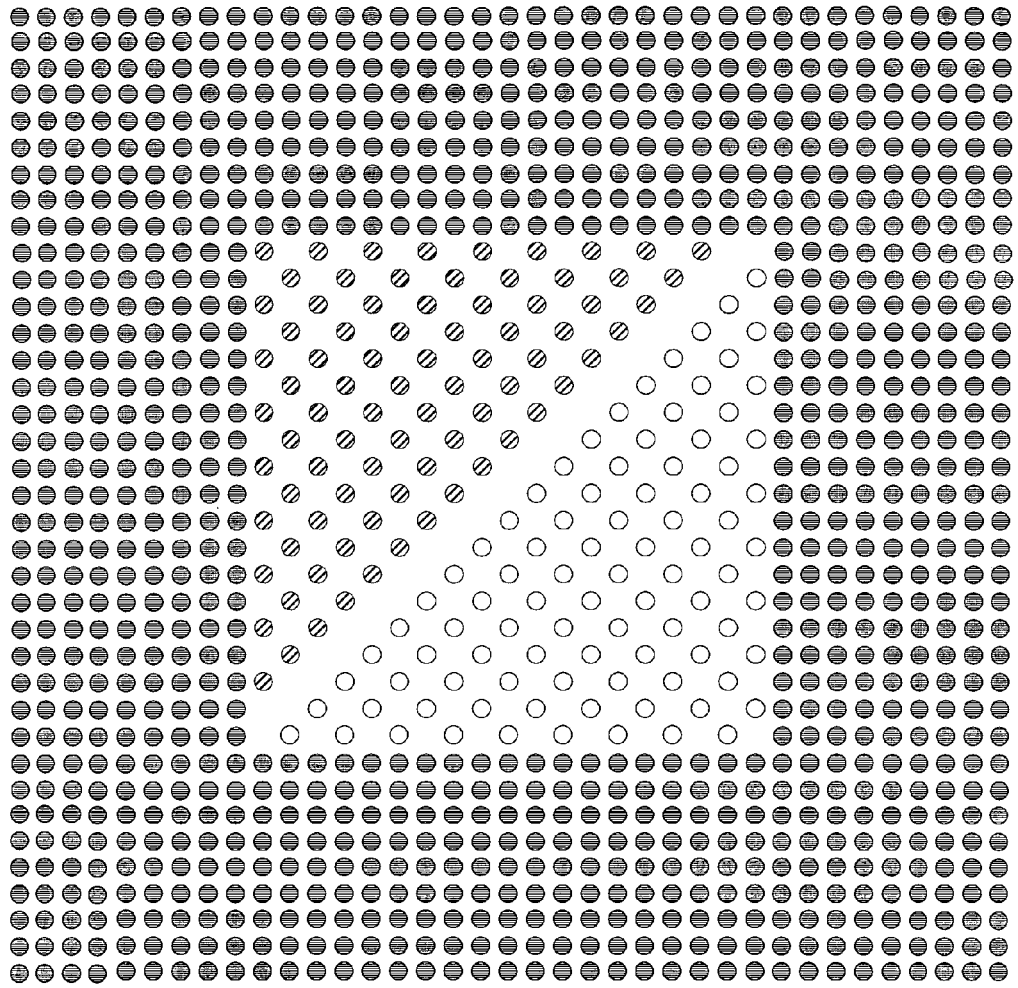
*FIG. 6B*
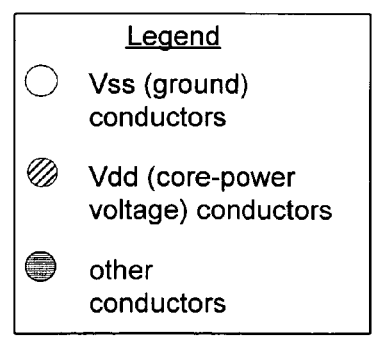

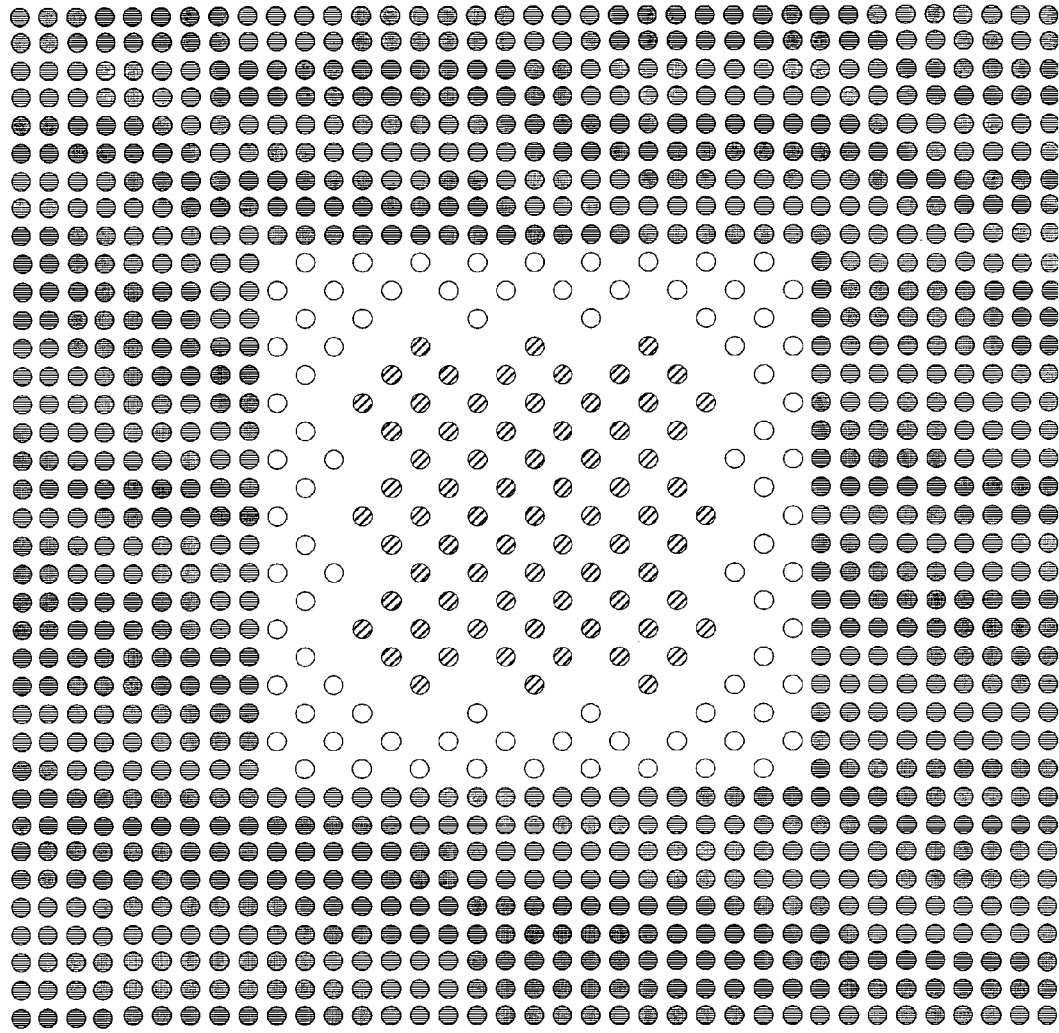
FIG. 7
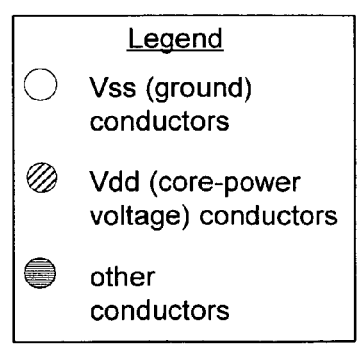

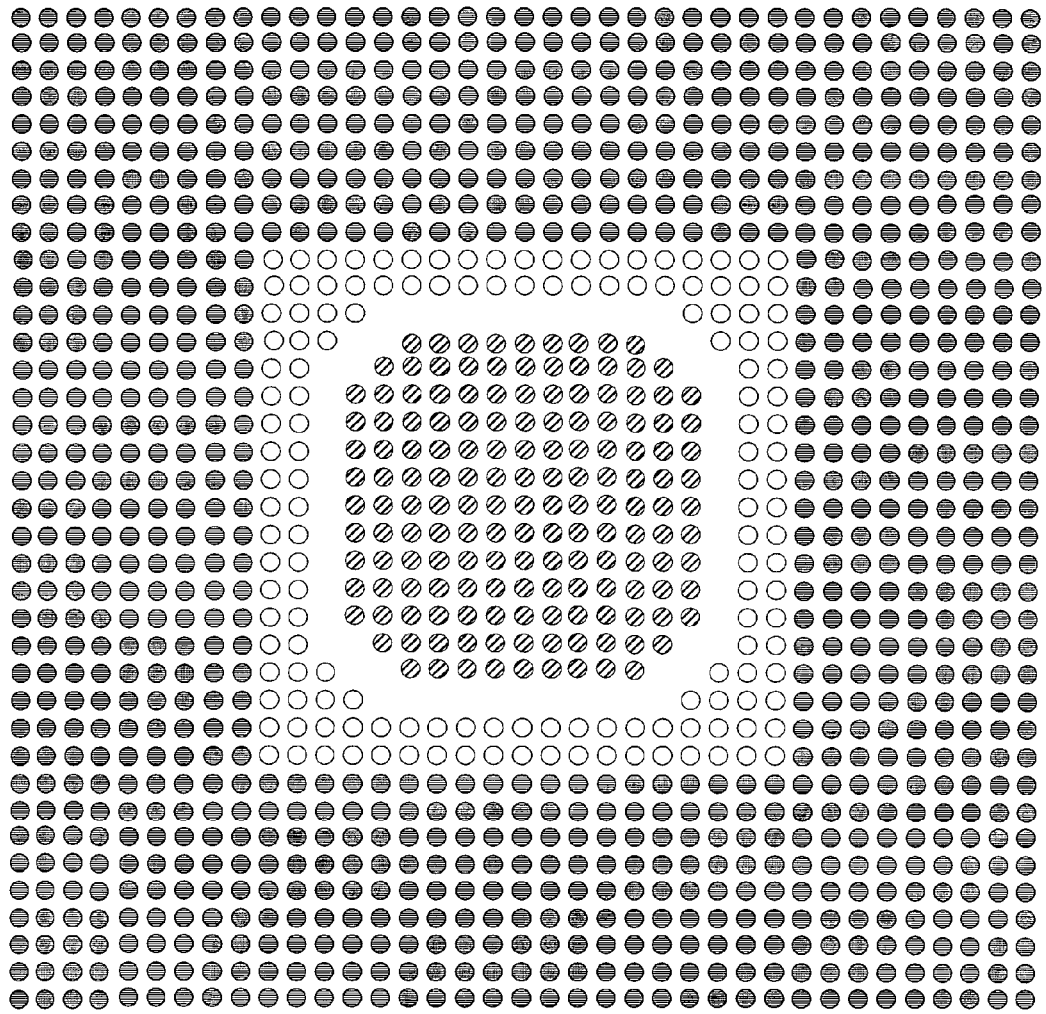
FIG. 8
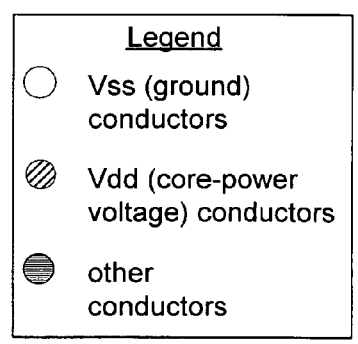

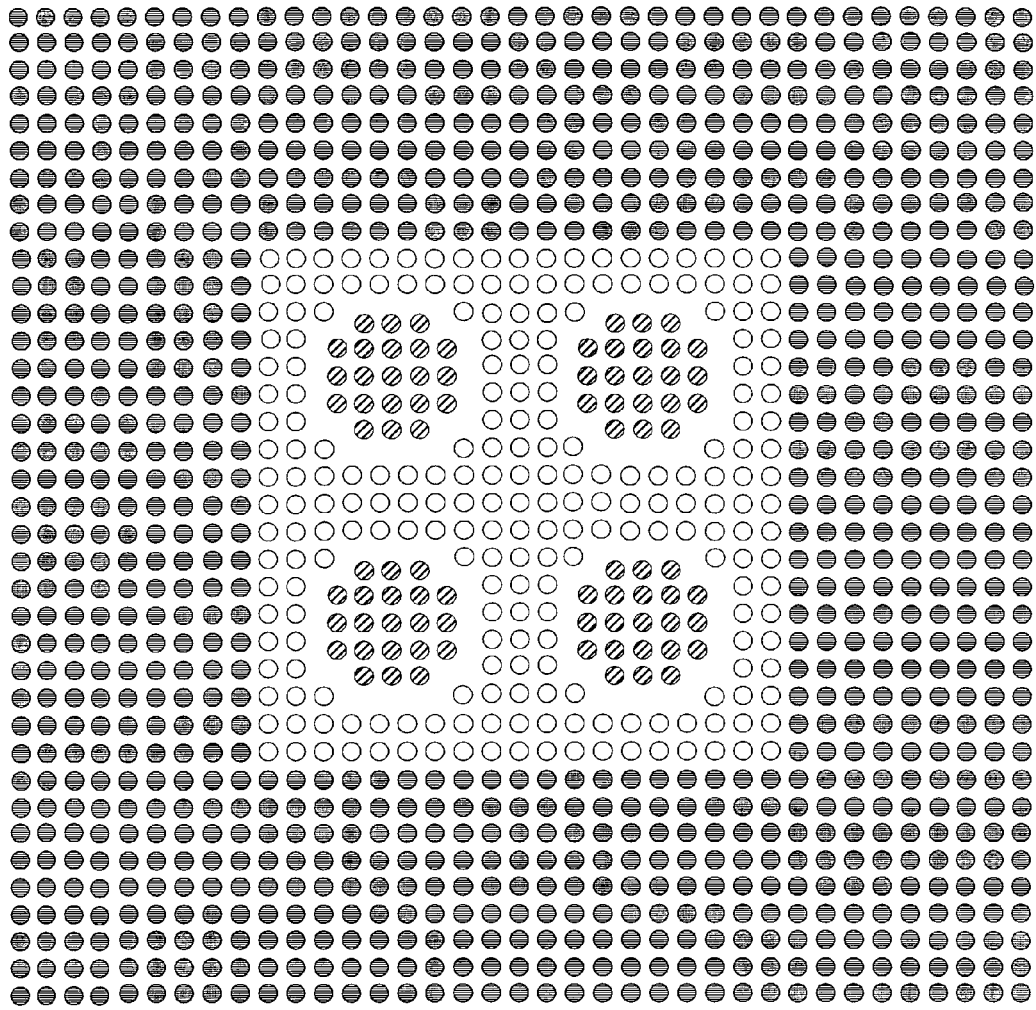
FIG.9
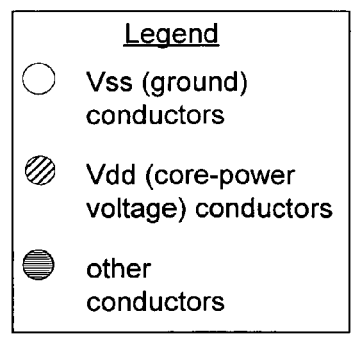

INTERCONNECT DESIGN FOR REDUCING RADIATED EMISSIONS

BACKGROUND OF THE INVENTION

1. Field of the Invention

This invention relates generally to electronic equipment, such as computers, and, more particularly, to apparatus and methods for reducing electromagnetic interference caused by integrated circuit devices.

2. Description of the Relevant Art

Many electronic devices such as integrated circuits generate undesirable amounts of electromagnetic interference (EMI) during operation. For example, processors mounted on printed circuit boards (PCBs) may cause electromagnetic radiated emissions by injecting high frequency current into the printed circuit board, which then couples, directly or indirectly, to neighboring integrated circuits and other components. Such coupling may interfere with the individual performance of the devices, and thus adversely affect the overall performance of the system. In addition, because of the negative effects of EMI, the level of acceptable radiated emissions is subject to strict regulatory limits. For these reasons, it is desirable to contain or suppress the EMI generated by an integrated circuit.

There are two major methods by which integrated circuits can produce radiation: heatsink coupling and power bus injection. Various components have been employed to mitigate one or both of these EMI coupling mechanisms in a system. Some solutions involve grounding a lid or heatsink on the component and/or building a Faraday cage around the EMI producing chip (e.g., a CPU). In addition, various components such as gaskets, skirts, panels, and doors may be included in a system to contain emissions. Such components represent an additional cost and potential point of failure, as they typically require a separate part that must be added to the printed circuit board or enclosure.

In some systems containing processors, the second harmonic of the processor operating frequency may be a significant contributor to EMI. The EMI effects may be a result of high frequency current generated by complementary metal-oxide semiconductor (CMOS) devices in the integrated circuit. As integrated circuit technology advances, processors operate at increased frequency and power, thus presenting even greater challenges in maintaining emissions within acceptable levels.

SUMMARY

Various methods for connecting integrated circuit devices to printed circuit boards may reduce radiated emissions. In some embodiments, a method for reducing radiated emissions in a computer system may include providing a filter effect at an interconnection between an integrated circuit device and a printed circuit board by a specific arrangement of power and ground connections. This filter effect may be implemented solely by the deliberate placement of power and ground conductors, without adding circuit elements to the interconnection, according to various embodiments and as described herein. The integrated circuit device may be coupled to a power subsystem of the printed circuit board through a power distribution bus. An interconnect between the integrated circuit device and the printed circuit board may be configured to implement a low-pass filter between the integrated device and the power subsystem of the printed circuit board. The filter may reduce radiated emissions produced during operation of the integrated circuit device while not affecting the delivery of low frequency current to power the integrated circuit device.

According to various embodiments, core-power voltage conductors and ground conductors may be arranged in such a way as to create a higher series inductance at an interconnection between an integrated circuit device and a printed circuit board than that created by a traditional checkerboard arrangement of equally spaced, alternating voltage conductors and ground conductors. Such arrangements may realize a low-pass filter between the integrated circuit device and a power subsystem on the printed circuit board to which it is coupled. In some embodiments, a grouping of voltage conductors and an adjacent grouping of ground conductors may be arranged such that the spacing between the voltage grouping and the ground grouping is greater than the spacing between the conductors in each of the groupings. A grouping of ground conductors may be arranged so that it surrounds an adjacent grouping of voltage conductors, in some embodiments. In some embodiments, there may be more than one pair of adjacent voltage groupings and ground groupings. Each pair may have greater spacing between the voltage grouping and the adjacent ground grouping than between the conductors in each grouping of the pair, in some embodiments.

In some embodiments, the low-pass filter as described above may be provided at a first level interconnect between a chip and substrate of an integrated circuit device. In such embodiments, the power and ground conductors may be implemented as conductive bumps or pads on the integrated circuit die. In other embodiments, the low-pass filter may be implemented at a second level interconnect between the integrated circuit device and the printed circuit board. In such embodiments, the power and ground conductors arranged to realize the filter may be implemented as any of various elements for providing an electrically conductive path between a substrate of an integrated circuit device and a printed circuit board, such as pins, pads, solder balls, bumps, or spring contacts on an integrated circuit package, socket, or interposer.

In some embodiments, a filter realized by an arrangement of core-power voltage conductors and ground conductors may reduce radiated emissions from the integrated circuit (e.g., emissions caused by switching of transistors in the integrated circuit at high frequencies). In certain embodiments, the filter may reduce radiated emissions at harmonics of the operating frequency of an integrated circuit. In one embodiment, the integrated circuit is a central processing unit.

In some embodiments, geometric redesign of core-power voltage and ground conductors may be driven by a method that includes: picking a target range of frequencies for filtering, re-arranging conductors of an integrated circuit, package, socket, and/or board design to implement a low-pass filter, simulating the design, analyzing the parasitics associated with the power distribution system, and repeating these operations until the simulation indicates that the target frequencies will be filtered. In such embodiments, simulations may also be used to determine, and thus to minimize, the effect of the redesigned geometric pattern of core-power voltage and ground conductors on the power integrity and signal integrity of the integrated circuit device.

BRIEF DESCRIPTION OF THE DRAWINGS

FIG. 1 illustrates a detailed view of a conventional arrangement of core-power voltage, ground, and other conductors in a pin grid array.

FIG. 6A illustrates a detailed view of an arrangement of core-power voltage, ground, and other conductors in a pin grid array, according to one embodiment.

FIG. 6B illustrates a detailed view of an arrangement of core-power voltage, ground, and other conductors in a pin grid array, according to another embodiment.

FIG. 7 illustrates a detailed view of an arrangement of core-power voltage, ground, and other conductors in a pin grid array, according to a third embodiment.

FIG. 8 illustrates a detailed view of an arrangement of core-power voltage, ground, and other conductors in a pin grid array, according to a fourth embodiment.

FIG. 9 illustrates a detailed view of an arrangement of core-power voltage, ground, and other conductors in a pin grid array, according to a fifth embodiment.

Figure 2:
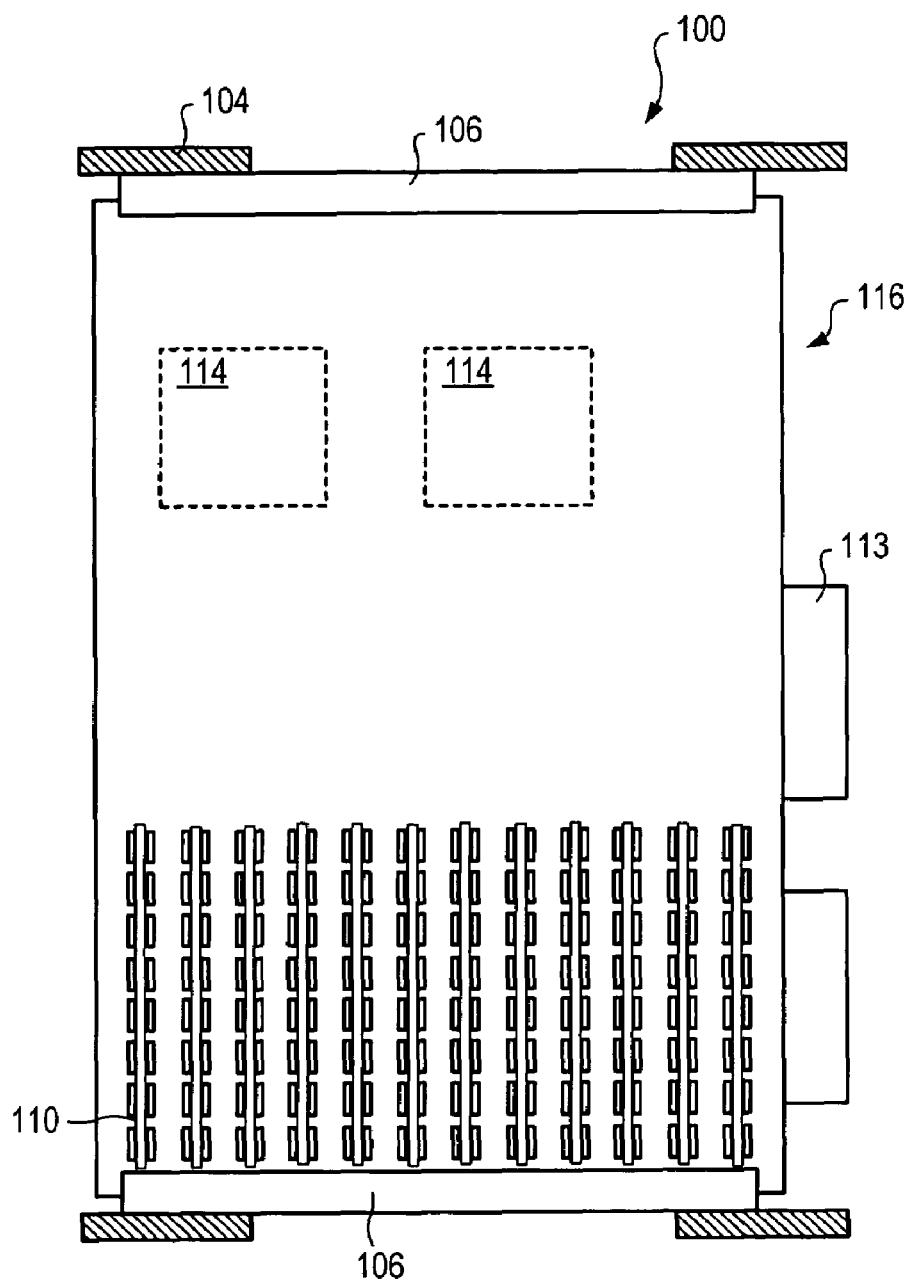
FIG. 2 illustrates an exemplary circuit module comprising processors and memory.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

The following description generally relates to apparatus and methods for reducing EMI in computer systems. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "module" includes any modular unit or subsystem. Examples of a module include, but are not limited to, a printed circuit board assembly, an information-processing cartridge, a memory module, a power supply, or a combination thereof. In certain embodiments, a module may include multiple circuit boards (e.g., a mezzanine card mounted to a main circuit board). In certain embodiments, components of a module may be housed in an enclosure.

As used herein, "circuit module" includes any module that includes or carries elements of an electrical circuit, electrical components (including, but not limited to, semiconductor devices, resistors, capacitors, relays, switches, and connectors), or conductors (e.g., wires, traces). As used herein, "circuit board" includes any circuit module that carries one or more other circuit modules or components. "Circuit board" includes, but is not limited to, a printed circuit board made of epoxy-glass and metal layers. As used herein, "component" includes any element of a system, including, but not limited to, a printed circuit board, a semiconductor device, a resistor, a capacitor, a power supply, or a disk drive.

As used herein, "enclosure" includes any structure that supports or houses one or more elements of a computer system (e.g., electronic modules). A module may be supported in an enclosure by various structures including, but not limited to, slides, rails, a shelf, or a bottom or wall of an enclosure.

As used herein, "coupled" includes a direct coupling or an indirect coupling (e.g., with one or more intervening elements) unless expressly stated otherwise. For example, an integrated circuit device may be coupled to a printed circuit board by directly attaching the integrated circuit device to the printed circuit board, or by mounting the integrated circuit device on a socket attached to the printed circuit board.

Often, an array of conductors on an integrated circuit (IC) and/or a socket containing the IC is used to provide electrical connections between the IC and a printed circuit board. These conductors include core-power voltage conductors, ground conductors and other conductors. FIG. 1 (prior art) depicts a traditional arrangement of such conductors, in which voltage conductors and ground conductors are implemented in a checkerboard pattern, with equally-spaced, alternating conductors, in the center of an array comprising these and other conductors.

In some embodiments, a geometric redesign of core-power voltage conductors and ground conductors may reduce radiated emissions from an integrated circuit device coupled to a printed circuit board. An integrated circuit may be coupled to a power subsystem of a printed circuit board through a power distribution bus. In some embodiments, a method for reducing radiated emissions in a computer system may include providing a low-pass filter effect at an interconnection between the integrated circuit device and the power subsystem of the printed circuit board by a specific arrangement of power and ground conductors. The filter effect may reduce current flowing in a conductive path in a frequency range-of interest. In some embodiments, an interconnect between an integrated circuit device and a printed circuit board may be configured to implement a low-pass filter between the integrated circuit device and the power subsystem of the printed circuit board. The filter may reduce radiated emissions produced during operation, in any of various operating modes, of the integrated circuit device, while not affecting the delivery of low frequency current to power the integrated circuit device. For example, the filter may reduce radiated emissions produced while the integrated circuit is operating in a reduced-power, reduced-function, or "sleep" mode, as well as when it is operating at normal conditions.

In some embodiments, a low-pass filter may be implemented at a second level interconnect of an integrated circuit by re-designating some voltage or ground contacts in a core power area of the interconnect. In other embodiments, a low-pass filter may be provided at a first level interconnect between an integrated circuit and a substrate. Such a low-pass filter may be designed to filter only high frequency current in the integrated circuit. Thus, it may reduce radiated emissions caused by high frequency switching in the integrated circuit, while maintaining performance of the system at lower frequencies. In one embodiment, the filter may be designed to reduce noise at particular harmonics of the core operating frequency of an integrated circuit, such as at the second and higher harmonics.

Signal or power integrity in a system may be compromised if low frequency current to integrated circuits (e.g., current from a power supply) is filtered to an excessive degree. In some embodiments, a filter implemented in an interconnect between an IC and a printed circuit board may be designed to filter current at high frequencies in order to reduce noise, but to allow current at lower frequencies to pass with little or no attenuation. Thus, EMI reduction may be achieved while maintaining the power and signal integrity of the system.

In some embodiments, a method for designing an interconnect for reducing radiated emissions, as described above, may be applied to a computer system containing one or more circuit modules, each comprising one or more integrated circuit devices, to reduce the overall EMI of the computer system. In such a computer system, a circuit module, such as a printed circuit board, may include one or more ICs coupled to the circuit module using an array of conductors. For example, FIG. 2 depicts a portion of a computer system 100, including circuit module (printed circuit board) 116. Computer system 100 may be suitable for implementation of an interconnect design for reducing EMI, as described herein. Printed circuit board 116 may be installed in enclosure 104 on rails 106. Printed circuit board 116 may include one or more integrated circuit devices 114 and one or more memory modules 110. Printed circuit board 116 may include connectors 113 for electrical connections with various external components of the system. Printed circuit board 116 may also include a power subsystem and wires or traces implementing a power distribution bus (not shown.)

Figure 3:
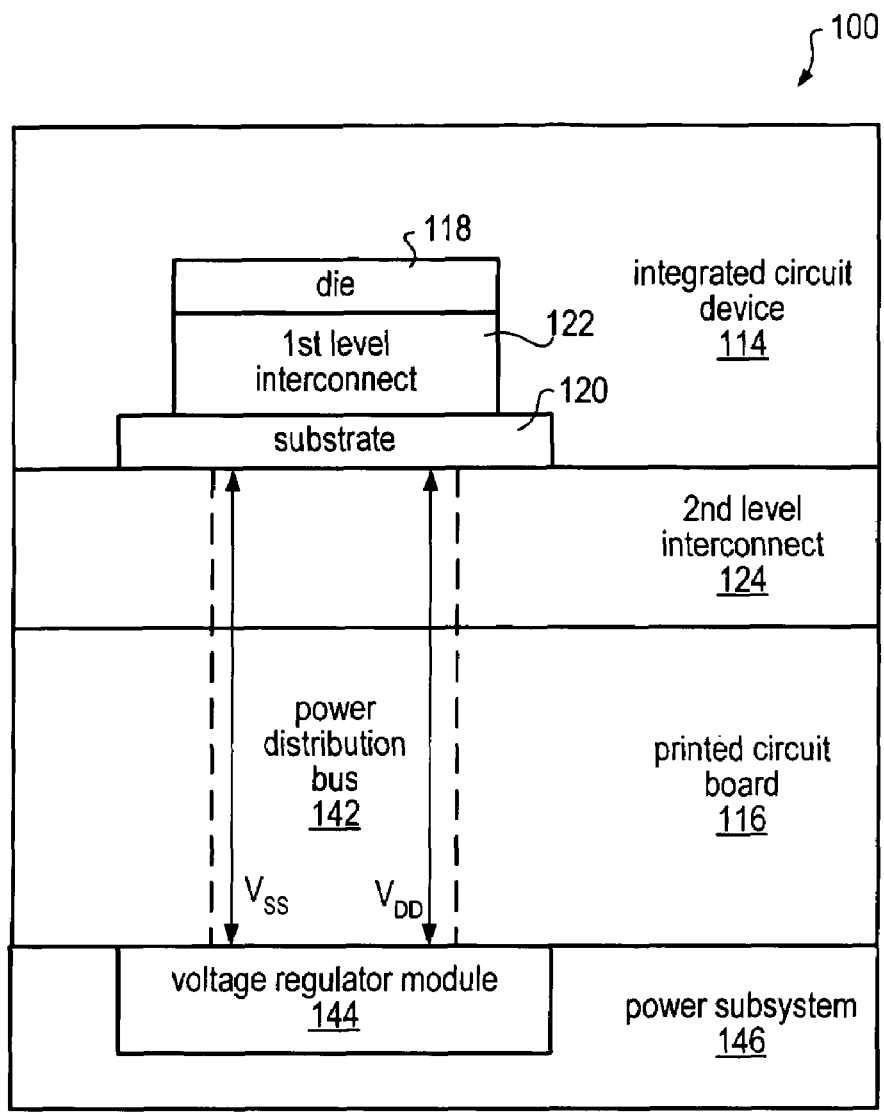
FIG. 3 depicts a block diagram of a system for reducing radiated emissions through design of a first or second level interconnect, according to one embodiment.

According to various embodiments, core-power voltage conductors and ground conductors providing electrical connections between integrated circuit device 114 and printed circuit board 116 may be arranged to implement a low-pass filter between integrated circuit device 114 and printed circuit board 116. This low-pass filter may reduce the amount of high frequency current injected into printed circuit board 116 from integrated circuit 114, and thus, may reduce the EMI of computer system 100. The core-power voltage conductors and ground conductors arranged to realize the low-pass filter may, in various embodiments, be implemented at a first level interconnect between an integrated circuit (die) within integrated circuit device 114 and a substrate within integrated circuit device 114 or in a second level interconnect between integrated circuit device 114 and printed circuit board 116. For example, FIG. 3 depicts an abstract block diagram of computer system 100 including an integrated circuit device 114 comprising a die 118 coupled to a substrate 120 at first level interconnect 122. Integrated circuit device 114 is then coupled to printed circuit board 116 at second level interconnect 124.

Computer system 100 may include power distribution bus 142. Power distribution bus 142 may connect integrated circuit device 114 with voltage regulator module 144 in power subsystem 146. As used herein, "bus" generally refers to one or more conductors that are used for the transmission of signals, data, or power from one or more sources to one or more destinations. A line of a bus may be a single conductive element, such as a metallized region on a circuit board, a combination of conductive elements connected to one another, or a combination of groups of disconnected elements. As used herein, "power subsystem" generally refers to any combination of components that supply or regulate electrical power. In some embodiments, integrated circuit device 114 and voltage regulator module 144 may be included on the same module. In other embodiments, integrated circuit device 114 and voltage regulator module 144 may be provided on separate modules.

In some embodiments, the arrangement of the core-power voltage conductors and ground conductors may be designed in such a way as to create a higher series inductance at first level interconnect 122 or second level interconnect 124 than that created by a traditional checkerboard arrangement of equally spaced, alternating voltage conductors and ground conductors, such as the arrangement illustrated by FIG. 1. In some embodiments, such an interconnect redesign may implement a low-pass filter between die 118 and power subsystem 146. In some embodiments, core-power voltage conductors may be arranged in one or more homogenous groupings of voltage conductors and ground conductors may be arranged in one or more homogenous groupings of ground conductors. These groupings may be patterned as any of various geometric shapes, including, but not limited to, squares, rectangles, circles, triangles, stars, rings, or any arbitrary shape, according to various embodiments. In some embodiments, the shape of the ground grouping and the voltage grouping may be the same, while in other embodiments they may be different. A grouping of ground conductors may be arranged so that it surrounds an adjacent grouping of voltage conductors, in some embodiments. In various embodiments, a grouping of—voltage conductors and an adjacent group of ground conductors may be arranged such that the spacing between the voltage grouping and the ground grouping is greater than the spacing between the conductors in each of the groupings. This greater spacing, or "gap", between the core-power voltage conductors and ground conductors may result in a higher series inductance at interconnect 122 or interconnect 124 than a traditional arrangement of voltage conductors and ground conductors. In other embodiments, the shapes of the voltage grouping and ground grouping themselves may result in this higher inductance, without such a gap.

In some embodiments, there may be more than one pair of adjacent voltage groupings and ground groupings. Each pair may have greater spacing between the voltage grouping and the adjacent ground grouping than between the conductors in each grouping of the pair, in some embodiments. For example, the conductors of an integrated circuit device comprising multiple processor cores or subsystems may be designed to implement one pair of adjacent voltage conductors and ground conductors, separated as described herein, providing power for each processor core or subsystem of the integrated circuit device. In embodiments comprising multiple pairs of voltage groupings and ground groupings, the ground groupings may not be separated by an amount greater than the spacing between ground conductors within the groupings. In other embodiments comprising multiple pairs of voltage groupings and ground groupings, the separation between the voltage grouping and adjacent ground grouping of one pair may be different than the separation between the voltage grouping and adjacent ground grouping of another pair. Note also that in some embodiments, the spacing between conductors within one voltage grouping may be different than the spacing between conductors within an adjacent ground grouping or within another voltage grouping. Similarly, the spacing between conductors within one ground grouping may be different than the spacing between conductors within an adjacent voltage grouping or within another ground grouping.

Figure 4A:
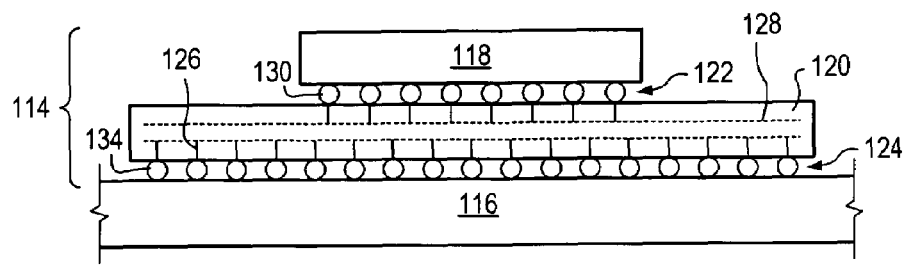
FIGS. 4A-4C illustrate side views of an integrated circuit device installed on a printed circuit board, according to various embodiments.
Figure 4B:
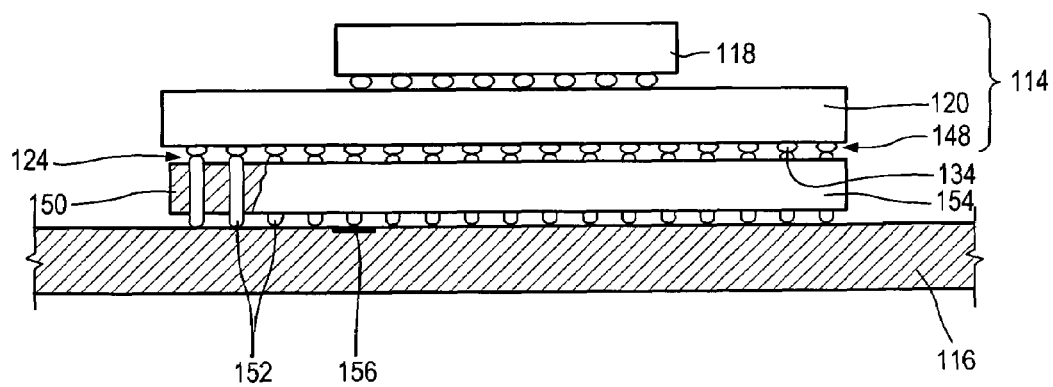
Figure 4C:
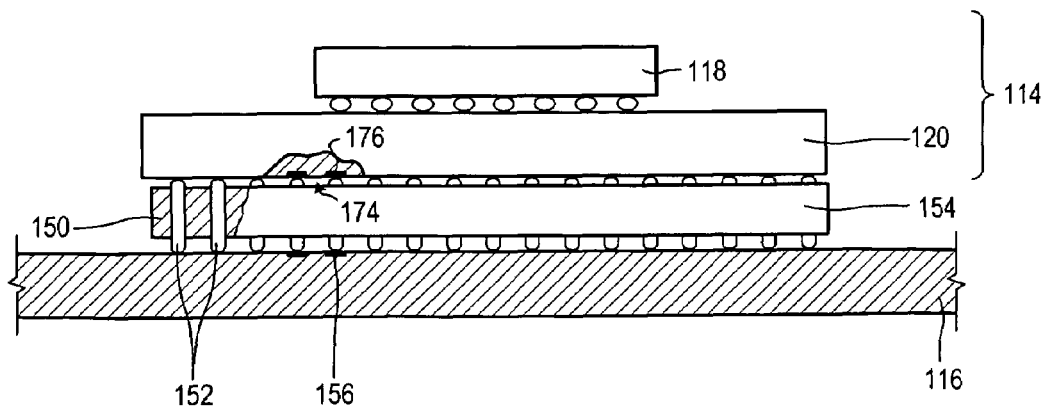

Various embodiments of an interconnect design for reducing EMI are illustrated in FIGS. 4A-4C and FIGS. 6A-9. FIGS. 4A-4C depict side views of integrated circuit (IC) device 114 mounted on printed circuit board 116, according to various embodiments. An integrated circuit, as used herein, may be, but is not limited to, a processor such as a central processing unit, an application specific integrated circuit (ASIC), or a memory chip. In some embodiments, an integrated circuit may include CMOS devices.

Integrated circuit device 114, as shown in FIGS. 4A-4C, may include a core that performs the primary function of the integrated circuit. The functions performed by the core may be that of a microprocessor, a digital signal processor, an interface chip (e.g., a chip to interface a processor to a peripheral bus), a peripheral controller, a floating point gate array (FPGA), or whatever other functions that an integrated circuit device is designed to perform, as desired. Integrated circuit device 114 may also include input/output (I/O) cells coupled to the core. The I/O cells may provide an interface between the core and other circuitry external to integrated circuit device 114. For example, the I/O cells may transmit signals generated within the core to external devices, or may receive and convey externally generated signals to the core. In some embodiments, the I/O cells are located on the same silicon die as the core. In other embodiments, the I/O cells are on a separate silicon die from the core.

As used herein, "core power" generally refers to power that is distributed to the core of the silicon chip in the package. As used herein, "I/O power" generally refers to power that is distributed to I/O cells coupled to the core. In some embodiments, the core power may have different voltage requirements than any I/O cells that provide an interface between external devices and the core logic of the die. In such embodiments, the core power and the I/O power may be distributed separately from each other. In other embodiments, the core power and the I/O cell power may have the same voltage requirements, and thus core power and I/O cell power may be distributed together (i.e., through the same connections).

According to various embodiments, implementing a low-pass filter between the core power of an integrated circuit, such as integrated circuit 114, and a printed circuit board, such as 116, to which integrated circuit 114 is coupled, may reduce the high frequency current injected from integrated circuit 114 into the power distribution system of printed circuit board 116. Reducing the high frequency current injected from integrated circuit device 114 may, in turn, reduce the EMI of a system comprising printed circuit board 116.

A low-pass filter between integrated circuit device 114 and printed circuit board 116 may be implemented at various interconnect levels and using various elements, according to various embodiments. For example, as illustrated in FIG. 4A, integrated circuit device 114 may include die 118. Die 118 may be coupled to a top surface of substrate 120. First level interconnect 122 may be provided between die 118 and substrate 120. Second level interconnect 124 may be provided between substrate 120 and printed circuit board 116.

Substrate 120 may include vias 126 and horizontal layers 128. Vias 126 and horizontal layers 128 may electrically connect contacts at first level interconnect 122 with corresponding contacts at second level interconnect 124. Horizontal layers 128 may include power planes, ground planes and signal layers. In one embodiment, vias 126 are plated through holes. It will be understood, however, that vias 126 may include any conductive elements that provide electrical connections through all or part of substrate 120.

A first level interconnect, such as first level interconnect 122, may include any of various elements for providing an electrically conductive path between a chip and a substrate. Examples of elements for first level interconnects include, but are not limited to, an array of solder bumps or pads. In certain embodiments, a first level interconnect may be a flip chip connection. As shown in FIG. 4A, first level interconnect 122 may include conductive bumps 130. Chip underfill may fill gaps between die 118 and substrate 120 in the area of conductive bumps 130. In certain embodiments, a low-pass filter may be implemented at any of the first level interconnects described above by the arrangement of one or more groupings of core-power voltage conductors (e.g., bumps, pads, etc.) and one or more groupings of ground conductors (e.g., bumps, pads, etc.). In some embodiments, the voltage groupings and ground groupings may be separated to create a gap between each voltage grouping and an adjacent ground grouping, further increasing the inductance.

A second level interconnect may include any of various elements for providing an electrically conductive path between a substrate of an integrated circuit device and a printed circuit board. Examples of such elements include, but are not limited to, pins, pads, sleeves, sockets, solder balls, bumps, columns, pillars, spring contacts, or a combination thereof. Examples of second level interconnect arrangements include, but are not limited to, area arrays such as pin grid arrays (PGA), micro pin grid arrays (μPGA), ball grid arrays (BGA), micro ball grid arrays (μBGA), or land grid arrays (LGA). Other examples of arrangements for second level interconnects include peripherally leaded packages, such as quad flat packs or plastic leaded chip carriers. In some embodiments, an integrated circuit device may be received in a socket (e.g., a zero-insertion force (ZIF) socket) on the printed circuit board. In other embodiments, an integrated circuit device may be directly coupled to a printed circuit board (e.g., soldered into plated through-holes on the printed circuit board). As shown in FIG. 4A, second level interconnect 124 may include an array of solder balls 134. Second level interconnect 124 may include connections for power, signal, and ground. In certain embodiments, a low-pass filter may be implemented at any of the second level interconnects described above by the arrangement of one or more groupings of core-power voltage conductors (e.g., pins, pads, etc.) and one or more groupings of ground conductors (e.g., pins, pads, etc.). In some embodiments, the voltage groupings and ground groupings may be separated to create a gap between each voltage grouping and an adjacent ground grouping, further increasing the inductance.

In some embodiments, a second level interconnect system for an integrated circuit device may include a socket having core-power voltage and ground conductors implemented as contacts. As used herein, "contact" generally refers to any conductive part that acts with another conductive part to make or break a circuit. Contacts may have various forms and shapes, including, but not limited to, a column, a rod, a plug, a bar, a hollow sleeve, a spring, or a tab. In some embodiments, a socket may include an interposer and an array of columns coupled to the interposer, and the columns on the socket may couple with a ball grid array on an integrated circuit device. In such embodiments, the columns and/or the solder balls of the ball grid array may be arranged to implement a low-pass filter between the integrated circuit and the printed circuit board on which the socket is mounted. For example, FIG. 4B depicts an integrated circuit device 114 mounted on printed circuit board 116. Integrated circuit device 114 may include die 118 coupled on substrate 120. Substrate 120 may include ball grid array 148 formed of solder balls 134.

Second level interconnect 124 may include socket 150. In some embodiments, such as that shown in FIG. 4B, a socket may be a separate element that is interposed between the integrated circuit and the printed circuit board. In other embodiments, a socket may be attached to or integrated with a printed circuit board assembly (e.g., a zero insertion force socket). Socket 150 may include contacts 152 and interposer 154. Interposer 154 may support and align contacts 152. Interposer 154 may be made of a dielectric material, such as plastic or ceramic. In one embodiment, as shown in FIG. 4B, contacts 152 are cylindrical columns. In other embodiments, contacts 152 may have various other forms, such as fuzz buttons or springs. Contacts 152 may extend between solder balls 134 on integrated circuit device 114 and pads 156 on printed circuit board 116.

In one embodiment, contacts 152 may be arranged to implement a low-pass filter between integrated circuit device 114 and printed circuit board 116, as described herein. In another embodiment, solder balls 134, contacts 152, and pads 156 may be arranged to implement such a low-pass filter. In certain embodiments, modifying a standard socket to remove or re-designate contacts at selected locations in the power distribution portion of the socket may produce a socket implementing a low-pass filter between integrated circuit device 114 and printed circuit board 116. For example, in a socket having buttons with conductive springs, selected springs may be removed to create a pattern of core-power voltage conductors and ground conductors that implements a low-pass filter.

In another embodiment, the columns on a socket may couple with pads of a land grid array on an integrated circuit device. For example, FIG. 4C depicts integrated circuit device 114, including land grid array 174. In this example, columns 152 and/or pads 176 may be arranged to implement a low-pass filter between the integrated circuit and the printed circuit board on which the socket is mounted. A low-pass filter may also be provided on interposer 154 between pads 176 on integrated circuit device 114 and corresponding pads 156 on printed circuit board 116.

In some embodiments, a power distribution bus for an integrated circuit may include a filter portion. The filter portion may be designed to reduce EMI injected by the integrated circuit onto the power distribution bus. For example, the filter portion may filter out high frequency processor noise before it can be injected into a printed circuit board and radiate from the system. In certain embodiments, the filter portion may be implemented at a second level interconnect between the integrated circuit device and a printed circuit board.

Figure 5:
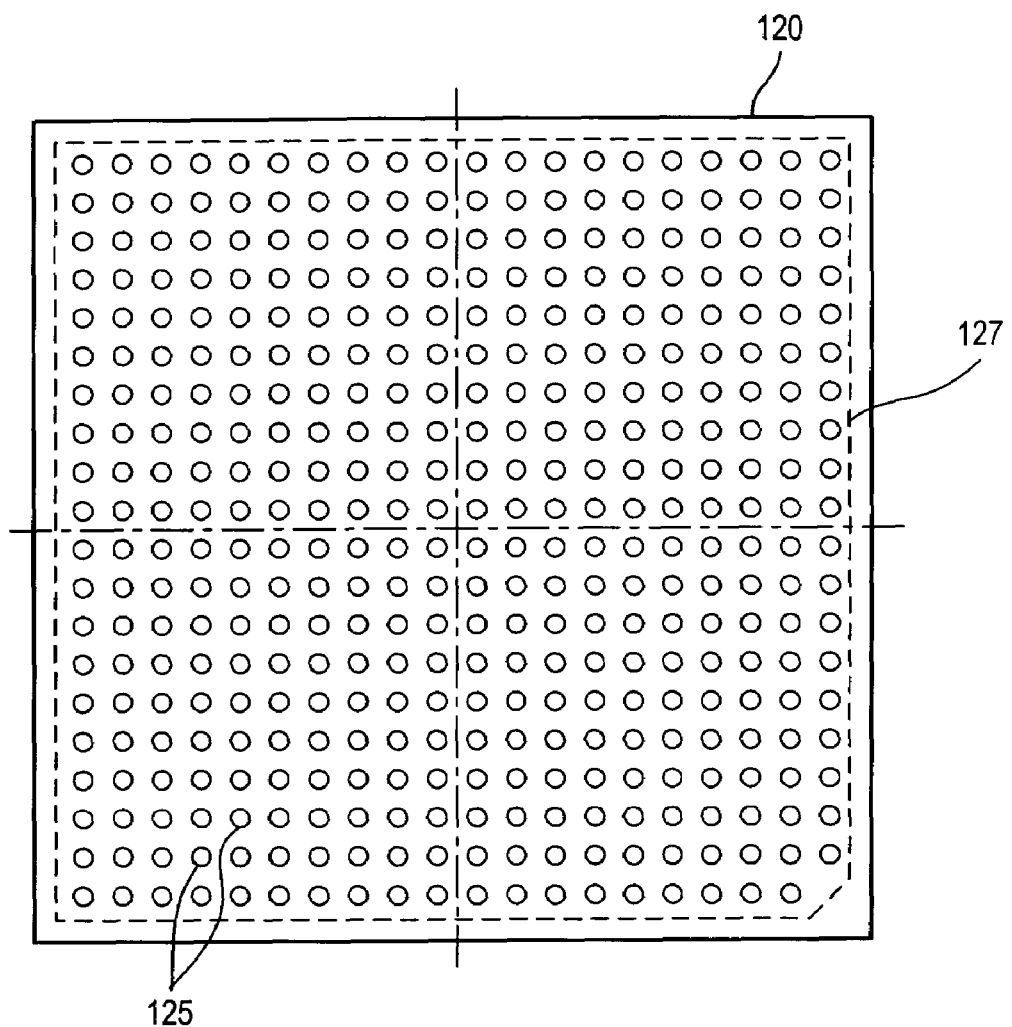
FIG. 5 illustrates a bottom view of an exemplary integrated circuit package comprising a pin grid array.

In some embodiments, core-power voltage conductors and ground conductors of a pin grid array may be arranged to implement a low-pass filter between an integrated circuit device and a printed circuit board. For example, FIG. 5 illustrates a view of an array 127 of pins 125 on a bottom surface of a substrate, such as substrate 120 of integrated circuit device 114. Pin grid array 127 of FIG. 5 may comprise various arrangements of core-power voltage supply pins, ground pins, and other pins, which may implement reduced EMI when coupled to a printed circuit board. In a traditional arrangement, pins 125 of pin grid array 127 would typically be assigned such that voltage supply pins and ground pins alternate, as in a checkerboard pattern.

In some embodiments of the present invention, the signals assigned or mapped to each pin 125 of pin grid array 127 may be chosen in such a way that a low-pass filter effect is provided between the integrated circuit device 114 and a printed circuit board. For example, the assignment of signals to pins 125 of pin grid array 127 may result in one or more groupings of voltage supply pins and ground pins, according to various embodiments. The shapes and arrangement of these voltage supply and ground pin groupings may, in some embodiments, create a low-pass filter between the core power of the integrated circuit device and a printed circuit board to which it is coupled. In some embodiments, the spacing between voltage supply pin groupings and ground pin groupings may be greater than the spacing between the voltage supply pins in the voltage supply pin grouping or the ground pins in the ground grouping. In such embodiments, the gap between the voltage supply pin groupings and the ground pin groupings may further increase the series inductance, as compared to a an arrangement of voltage supply pins and ground pins without such a gap.

Various embodiments of a pin grid array in which one or more voltage supply pin groups and one or more ground pin groups are arranged to implement a low-pass filter between the core power of an integrated circuit device and a printed circuit board to which it is coupled are illustrated by FIGS. 6A-9. According to various embodiments, groupings of voltage supply pins and groupings of ground pins may be patterned as any of the geometric shapes illustrated or as any other shapes that may create a low-pass filter, as described herein. In some embodiments, such as those illustrated in FIGS. 6B-9, the arrangement of voltage supply pins and ground pins may result in a gap between one or more groupings of voltage supply pins and corresponding adjacent grouping(s) of ground pins. FIGS. 6A and 6B, for example, illustrate two different embodiments in which all of the voltage supply pins of the integrated circuit device are arranged to form one triangular shape and all of the ground pins of the integrated circuit device are arranged to form a second triangular shape. In FIG. 6A, the triangular grouping of voltage supply pins is not separated from the triangular grouping of ground pins, while in FIG. 6B, the triangular groupings are separated by a gap shaped as a diagonal line between them. This gap between the grouping of voltage supply pins and the grouping of ground pins may create a higher series inductance than an arrangement of voltage supply pins and ground pins without such a gap. In various embodiments, the shape and arrangement of the voltage supply pin group and ground pin group, with or without such a gap, may create a low-pass filter as described above.

In another example, FIG. 7 illustrates a single voltage supply pin grouping surrounded by a single ground pin grouping. In this example, the voltage grouping and the ground grouping may be created by removing pins from a standard socket or package design of alternating voltage supply pins and ground pins to leave only voltage supply pins in the center of the grid and only ground pins surrounding the voltage supply pin grouping. If this arrangement is created by removing pins, the spacing between the pins in the voltage grouping and the spacing between the pins in the ground grouping may be greater than the original pitch of pins in the array. In this example, additional pins may be removed to form a gap between the voltage supply pin grouping and the ground pin grouping that is greater than the spacing between the pins in each grouping. Again, the shape and arrangement of the voltage supply pin grouping and the ground pin grouping, with or without this gap, may have the effect of implementing a low-pass filter between the core power of the integrated circuit device and a printed circuit board to which it is coupled.

Similar to FIG. 7, FIG. 8 illustrates a single voltage supply pin grouping surrounded by a single ground pin grouping. However, in this example, rather than removing pins, the pins have been re-designated to create a circular grouping of core-power voltage pins having the original grid pitch, surrounded by a ring-shaped grouping of ground pins also having the original grid pitch. Again, the shape and arrangement of the pins may create a low-pass filter between the core power of the integrated circuit device and a printed circuit board to which it is coupled. In this example, some pins have been removed to form a gap between the voltage supply pin grouping and the ground pin grouping and this gap may serve to further increase the inductance at the interconnection.

In some embodiments, an integrated circuit device may comprise more than one pair of voltage supply pin groupings and adjacent ground pin groupings. One example of such an embodiment is illustrated in FIG. 9. In this example, the pin grid array includes four circular groupings of voltage supply pins. Four rings of ground pins surround the voltage supply pin groupings, with a gap between each of the circular voltage supply pin groupings and the adjacent ground pin ring. In this example, there is no separation between the four rings of ground pins. In other embodiments, the four rings of ground pins may be separated from each other by a gap or by additional pins. In this example, each of the gaps formed between the ground pins and the voltage supply pin groupings may produce a higher series inductance than a traditional checkerboard arrangement of voltage supply pins and ground pins. In some embodiments, such an arrangement of voltage supply pin groupings and ground pin groupings, with or without these gaps, may create a low-pass filter as described above.

While FIGS. 6A-9 illustrate various arrangements of core-power voltage pins and ground pins in a pin grid array, such as pin grid array 127, it should be understood that similar or different arrangements of core-power voltage conductors and ground conductors may be implemented using any of the various elements described above for providing an electrically conductive path between an integrated circuit and a printed circuit board at a first or second level interconnect. For example, similar arrangements of conductive bumps, pads, pins or other contacts of an integrated circuit, package, or socket may be used to reduce radiated emissions of an integrated circuit device coupled to a printed circuit board. These arrangements may be created during design of the integrated circuit, package, or socket, or may be created by removing contacts, such as springs or pins, of a standard or traditional package or socket design, or by re-designating such contacts. In some embodiments, re-designating contacts may involve re-wiring connections on a printed circuit board, such as by changing the path of metal traces on one or more layers of a printed circuit board.

Figure 10:
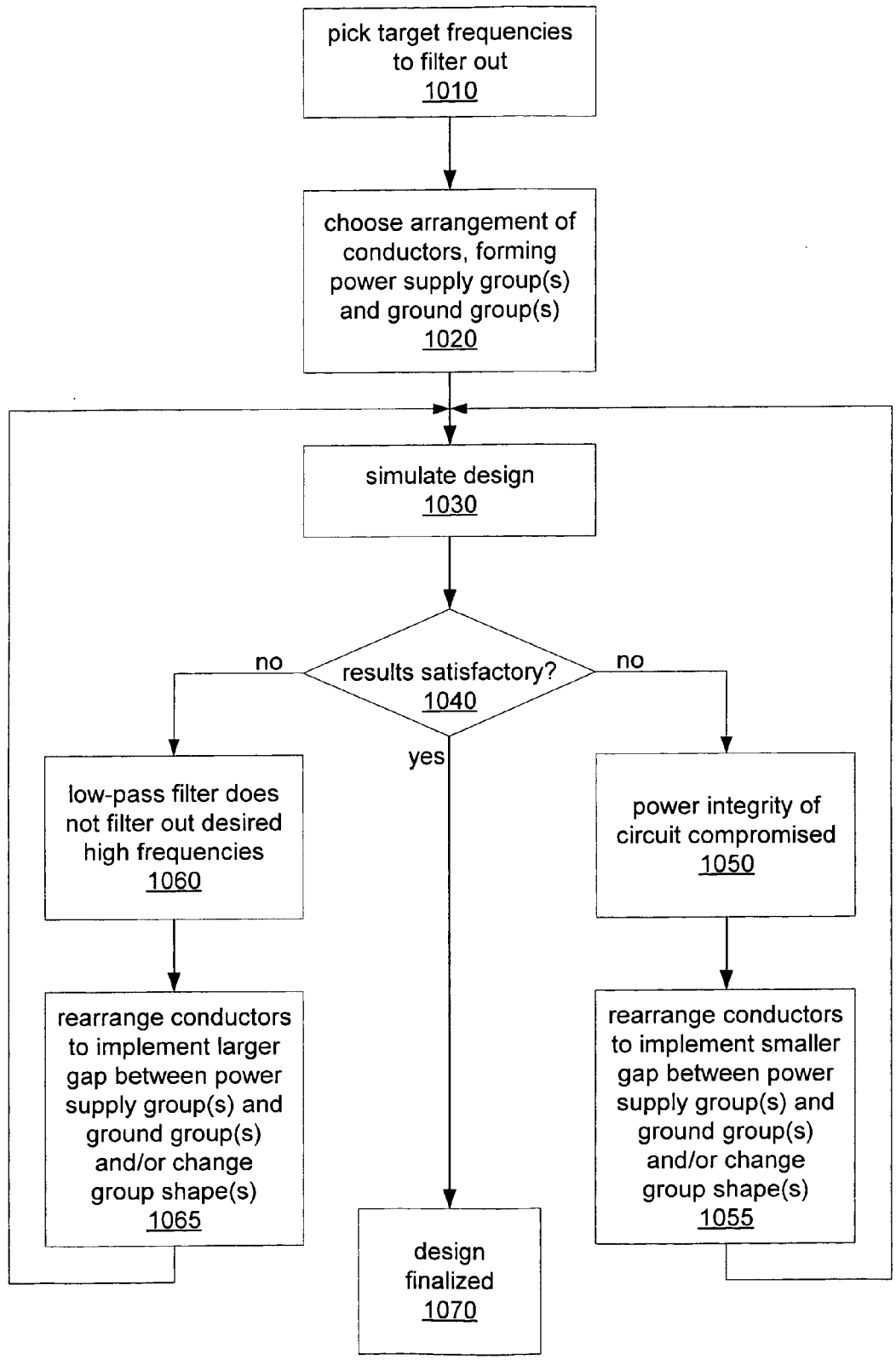
FIG. 10 is a flow chart illustrating one embodiment of a method for designing an interconnect for reducing radiated emissions.

In some embodiments, a method for designing an interconnect for reducing radiated emissions of an integrated circuit may involve an iterative approach, as illustrated by the flow chart in FIG. 10. In this example, the method may first involve picking a target range of frequencies to filter out, as in 1010. In some embodiments, these target frequencies may be particular harmonics of the core operating frequency of the integrated circuit, such as the second and higher harmonics.

In some embodiments, a next step may be to choose an arrangement of core-power voltage conductors and ground conductors in which one or more groupings of voltage conductors and adjacent ground conductors are shaped and/or separated to increase inductance, as in 1020. The arrangement of the conductors, with or without a gap between the core-power voltage groupings and the ground groupings, may act as a low-pass filter, as described above. The spacing between core-power voltage groupings and ground groupings may contribute to the series inductance between the core power area of the integrated circuit device and the power subsystem of the printed circuit board, with a larger gap between the groupings resulting in greater inductance. In some embodiments, if the gap is too small, the resulting low-pass filter may not filter out the desired high frequencies. In other embodiments, if the gap between the groupings is too large, the power integrity of the integrated circuit device may be negatively affected. In still other embodiments, surrounding one or more core-power voltage groupings with one or more ground groupings may yield the desired results. In some embodiments, the shapes and arrangement of the voltage groupings and ground groupings themselves, without a gap between them, may create a suitable low-pass filter.

In some embodiments, the chosen interconnect design may be simulated before fabrication in order to predict the effects of the design, as in 1030. For example, the design may be entered into a physical design tool (e.g., a 3D solid modeler), from which estimated parasitics may be extracted and used as inputs to a SPICE simulation or other circuit simulation software package. This simulation may be used to determine whether or not the desired frequencies will be filtered, in some embodiments. It may also be used to analyze the parasitics associated with the power distribution system to determine if the chosen arrangement has a negative effect on the power or signal integrity of the integrated circuit, in various embodiments.

Once the design is simulated, the results may be examined to see if the desired results have been achieved, as in 1040. If the low-pass filter implemented by the chosen conductor arrangement does not filter out the target frequencies, as in 1060, the gap between voltage conductor group(s) and ground group(s) may be too small or the shape of the group(s) may not be suitable. In some embodiments, the conductors may be re-arranged to implement a larger gap or a different shape, as in 1065, and the design re-simulated, as in 1030.

If the power integrity of the integrated circuit has been compromised, as in 1050, the gap between voltage conductor group(s) and ground group(s) may be too large or the shape of the group(s) may not be suitable. In some embodiments, the conductors may be re-arranged to implement a smaller gap or a different shape, as in 1055, and the design re-simulated, as in 1030.

In some embodiments, several arrangements of conductors may be chosen and these operations repeated until a simulation indicates that the target frequencies will be filtered and any negative effects on power integrity will be minimized to within allowable limits. Once successful simulation results are achieved, the interconnect design may be finalized, as in 1070. Thus, in some embodiments, the iterative method illustrated by FIG. 10, including circuit simulations of various interconnect designs, may be used to optimize the design so that the inductance attributable to the shapes of, and any gap between, the core-power voltage conductor group(s) and ground conductor group(s) is high enough to create a filter for the desired frequency range, but low enough to maintain the power and signal integrity of the integrated circuit device.

Figure 11:
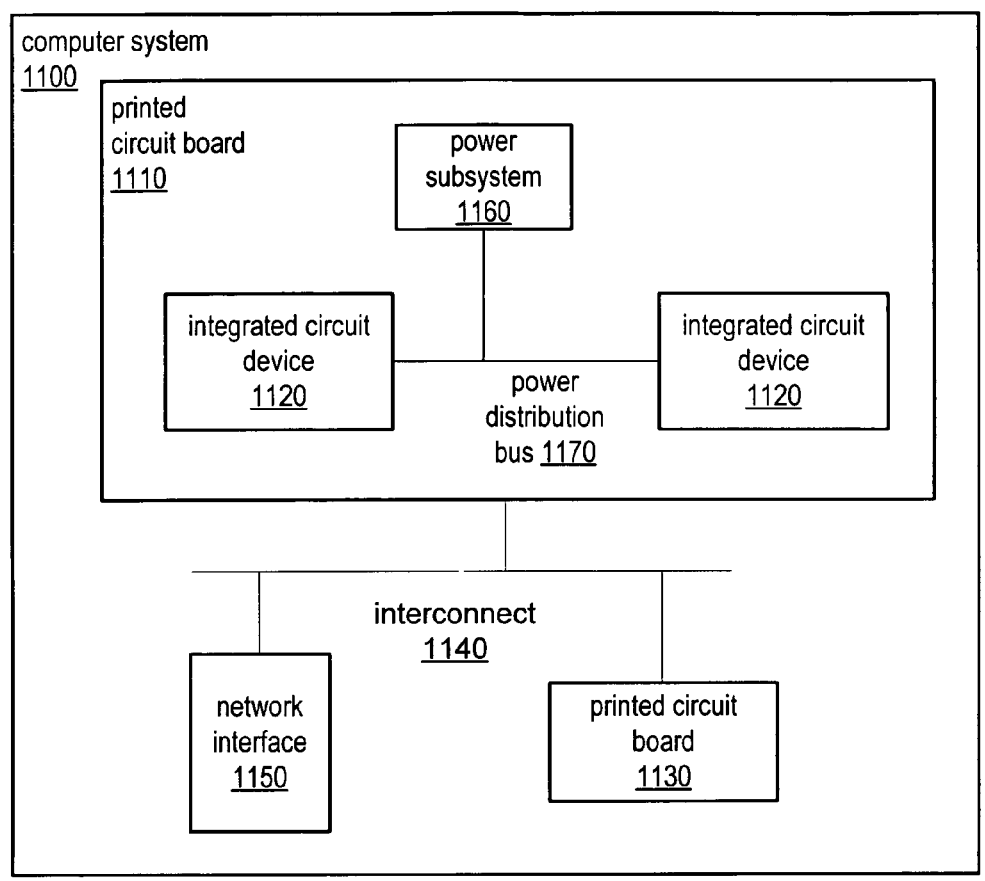
FIG. 11 illustrates a block diagram of a computer system suitable for implementation of an interconnect design for reducing radiated emissions, according to one embodiment.

The elements and methods for reducing radiated emissions described herein may be applied to any of a variety of computing systems. For example, FIG. 11 illustrates a computing system suitable for implementing interconnect design for reduced EMI, as described herein and according to various embodiments. Computer system 1100 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc, or in general any type of computing device.

Computer system 1100 may include at least one printed circuit board 1110. Printed circuit board 1110 may include at least one integrated circuit device 1120. Integrated circuit device 1120 may include a core that performs the primary function of the integrated circuit. The functions performed by the core may be that of a microprocessor, a digital signal processor, an interface chip (e.g., a chip to interface a processor to a peripheral bus), a peripheral controller, a floating point gate array (FPGA), or whatever other functions that an integrated circuit device is designed to perform, as desired. Integrated circuit device 1120 may also include input/output (I/O) cells coupled to the core. In some embodiments, integrated circuit device 1120 may include CMOS devices.

Printed circuit board 1110 may include at least one power subsystem 1160. Power subsystem 1160 may couple across power distribution bus 1170 to provide power to one or more integrated circuit devices 1120. Printed circuit board 1110 may be coupled to printed circuit board 1130 via interconnect 1140. Printed circuit board 1110 may also be coupled to network interface 1150 via interconnect 1140. In some embodiments, power subsystem 1160 may be implemented as part of one of integrated circuit devices 1120 rather than as a separate component of printed circuit board 1110. In other embodiments, power subsystem 1160 may be implemented on a printed circuit board other than the one containing integrated circuit device 1120, such as printed circuit board 1130.

According to various embodiments, such as those described herein, core-power voltage conductors and ground conductors at one or more levels of interconnect may be designed to implement a low-pass filter between a circuit on integrated circuit device 1120 and power subsystem 1160, which may in turn reduce the EMI of computer system 1100 generated by integrated circuit device 1120. In some embodiments, the elements and methods described herein may be applied to one integrated circuit device or to multiple integrated circuit devices, contained on one or more printed circuit boards of computer system 1100.

While the present invention has been described with reference to particular embodiments, it will be understood that the embodiments are illustrative and that the invention scope is not so limited. Many variations, modifications, additions, and improvements are possible. Accordingly, plural instances may be provided for components described herein as a single instance. Boundaries between various components are somewhat arbitrary, and particular components are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A computer system, comprising:
   one or more printed circuit boards, wherein one of the printed circuit boards comprises a power subsystem;
   an integrated circuit device comprising a die and a package, wherein the die is coupled to the package at a first level interconnect, and wherein the package is coupled to the one of the one or more printed circuit boards at a second level interconnect; and
   a power distribution bus connecting the power subsystem to the integrated circuit device;
   wherein at least one of the first or second level interconnects comprises a plurality of power supply voltage conductors and a plurality of ground conductors, wherein the plurality of power supply voltage conductors comprises one or more voltage groups, wherein the plurality of ground conductors comprises one or more ground groups, and wherein at least one of the voltage groups and an adjacent one of the ground groups are arranged so as to implement a low pass filter between the die and the power subsystem of the printed circuit board; and
   wherein the power supply voltage conductors of the at least one of the voltage groups and the ground conductors of the adjacent one of the ground groups are arranged in such a way as to create a higher series inductance at the at least one of the first or second level interconnects than an arrangement comprising an alternating pattern of power supply voltage conductors and ground conductors having equal spacing between each pair of adjacent power supply voltage and ground conductors.

2. The computer system of claim 1, wherein the adjacent one of the ground groups is patterned to surround the at least one of the voltage groups.

3. The computer system of claim 1, wherein the at least one of the voltage groups and the adjacent one of the ground groups are separated by an amount greater than a spacing between conductors within the at least one of the voltage groups or the adjacent one of the ground groups.

4. The computer system of claim 1, wherein the at least one of the voltage groups and the adjacent one of the ground groups provide power supply voltage and ground interconnections between the die and the package.

5. The computer system of claim 1, wherein the at least one of the voltage groups and the adjacent one of the ground groups provide power supply voltage and ground interconnections between the package and a socket containing the integrated circuit device coupled to the printed circuit board.

6. The computer system of claim 1, wherein the at least one of the voltage groups and the adjacent one of the ground groups provide power supply voltage and ground interconnections between a socket containing the integrated circuit device and the printed circuit board.

7. An integrated circuit device, comprising:
   a die; and
   a package;
   wherein the die is coupled to the package at a first level interconnect;
   wherein the package is configured for coupling to a printed circuit board at a second level interconnect;
   wherein at least one of the first or second level interconnects comprises a plurality of power supply voltage conductors and a plurality of ground conductors, wherein the plurality of power supply voltage conductors comprises one or more voltage groups, wherein the plurality of ground conductors comprises one or more ground groups, and wherein at least one of the voltage groups and an adjacent one of the ground groups are arranged so as to implement a low pass filter between the die and a power subsystem when the integrated circuit device is in operation; and
   wherein the adjacent one of the ground groups is patterned to surround the at least one of the voltage groups.

8. The integrated circuit device of claim 7, wherein the power supply voltage conductors of the at least one of the voltage groups and the ground conductors of the adjacent one of the ground groups are arranged in such a way as to create a higher series inductance at the at least one of the first or second level interconnects than an arrangement comprising an alternating pattern of power supply voltage conductors and ground conductors having equal spacing between each pair of adjacent power supply voltage and ground conductors.

9. The integrated circuit device of claim 7, wherein the at least one of the voltage groups and the adjacent one of the ground groups are separated by an amount greater than a spacing between conductors within the at least one of the voltage groups or the adjacent one of the ground groups.

10. The integrated circuit device of claim 7, wherein the at least one of the voltage groups and adjacent ones of the ground groups comprise a plurality of pairs of voltage groups and adjacent ground groups.

11. The integrated circuit device of claim 7, wherein the plurality of power supply voltage conductors and the plurality of ground conductors are implemented as conductive bumps or pads on said die.

12. The integrated circuit device of claim 7, wherein the plurality of power supply voltage conductors and the plurality of ground conductors are implemented as pins, solder balls, or pads on said package.

13. The integrated circuit device of claim 7, further comprising a socket;
wherein the package is coupled to the socket;
wherein the socket is configured to be coupled to a printed circuit board; and
wherein one of the at least one of the voltage groups and the adjacent one of the ground groups provide power supply voltage and ground interconnections at the second level interconnect through the socket.

14. An integrated circuit device, comprising a die;
wherein the die comprises a plurality of power supply voltage conductors and a plurality of ground conductors;
wherein the plurality of power supply voltage conductors comprises one or more voltage groups, wherein the plurality of ground conductors comprises one or more ground groups, and wherein at least one of the voltage groups and an adjacent one of the ground groups are arranged so as to implement a low pass filter between the die and a power subsystem when the integrated circuit device is in operation; and
wherein the at least one of the voltage groups and the adjacent one of the ground groups are separated by an amount greater than a spacing between conductors within the at least one of the voltage groups or the adjacent one of the ground groups.

15. The integrated circuit device of claim 14, wherein the power supply voltage conductors of the at least one of the voltage groups and the ground conductors of the adjacent one of the ground groups are arranged in such a way as to create a higher series inductance between the die and the power subsystem than an arrangement comprising an alternating pattern of power supply voltage conductors and ground conductors having equal spacing between each pair of adjacent power supply voltage and ground conductors.

16. The integrated circuit device of claim 14, wherein the at least one of the voltage groups and adjacent ones of the ground groups comprise a plurality of pairs of voltage groups and adjacent ground groups, and wherein the plurality of pairs of voltage groups and adjacent ground groups are patterned to implement greater spacing between a voltage group and an adjacent ground group of each pair than a spacing between conductors within the voltage group or the adjacent ground group of each pair.

17. The integrated circuit device of claim 14, wherein the plurality of power supply voltage conductors and the plurality of ground conductors are implemented as conductive bumps.

18. The computer system of claim 1, wherein the at least one of the voltage groups and adjacent ones of the ground groups comprise a plurality of pairs of voltage groups and adjacent ground groups, and wherein the plurality of pairs of voltage groups and adjacent ground groups are patterned to implement greater spacing between a voltage group and an adjacent ground group of each pair than a spacing between conductors within the voltage group or the adjacent ground group of each pair.

19. The integrated circuit device of claim 10, wherein the plurality of pairs of voltage groups and adjacent ground groups are patterned to implement greater spacing between a voltage group and an adjacent ground group of each pair than a spacing between conductors within the voltage group or the adjacent ground group of each pair.

20. The integrated circuit device of claim 14, wherein the adjacent one of the ground groups is patterned to surround the at least one of the voltage groups.

* * * * *